US012228606B2

(12) United States Patent
Yi

(10) Patent No.: US 12,228,606 B2
(45) Date of Patent: Feb. 18, 2025

(54) BATTERY PACK SIMULATION APPARATUS AND METHOD OF CHECKING BATTERY MANAGEMENT UNIT BY USING SAME

(71) Applicant: LG ENERGY SOLUTION, LTD., Seoul (KR)

(72) Inventor: Yeon Ok Yi, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 0 days.

(21) Appl. No.: 17/769,380

(22) PCT Filed: Jan. 27, 2021

(86) PCT No.: PCT/KR2021/001047
§ 371 (c)(1),
(2) Date: Apr. 15, 2022

(87) PCT Pub. No.: WO2021/153976
PCT Pub. Date: Aug. 5, 2021

(65) Prior Publication Data
US 2024/0027517 A1 Jan. 25, 2024

(30) Foreign Application Priority Data

Jan. 30, 2020 (KR) .......................... 10-2020-0011365
Nov. 27, 2020 (KR) .......................... 10-2020-0162970

(51) Int. Cl.
*G01R 31/28* (2006.01)
*G01R 31/3842* (2019.01)
(Continued)

(52) U.S. Cl.
CPC ..... *G01R 31/2827* (2013.01); *G01R 31/3842* (2019.01); *G01R 35/00* (2013.01);
(Continued)

(58) Field of Classification Search
CPC .............. G01R 31/2827; G01R 31/389; G01R 31/3842; G01R 35/00; G06F 30/20;
(Continued)

(56) References Cited

U.S. PATENT DOCUMENTS 6,081,100 A 6/2000 Guthrie
6,204,647 B1 * 3/2001 Niemann ............... G01R 31/36
327/563
(Continued)

FOREIGN PATENT DOCUMENTS

CN 101394096 A 3/2009
CN 101762800 A 6/2010
(Continued)

OTHER PUBLICATIONS

Extended European Search Report for European Patent Application No. 21747249.7 dated Oct. 27, 2022.
(Continued)

*Primary Examiner* — Farhana A Hoque
*Assistant Examiner* — Joseph O Nyamogo
(74) *Attorney, Agent, or Firm* — Birch, Stewart, Kolasch & Birch, LLP

(57) ABSTRACT

A battery pack simulation device includes an input unit that receives voltage values, current values, temperature, and initial impedance values, an output value generation unit that generates an output value based on the input voltage value, current value, temperature, and initial impedance value, an output unit that transmits the generated output value to the battery management unit, and a monitoring unit that monitors the operation of the battery management unit.

14 Claims, 3 Drawing Sheets

(51) Int. Cl.
  *G01R 31/389* (2019.01)
  *G01R 35/00* (2006.01)
  *G06F 30/20* (2020.01)
  *H01M 10/42* (2006.01)
  *H01M 10/48* (2006.01)
  *H02H 7/18* (2006.01)

(52) U.S. Cl.
  CPC .......... *G06F 30/20* (2020.01); *H01M 10/425* (2013.01); *H01M 10/4285* (2013.01); *H01M 10/48* (2013.01); *G01R 31/389* (2019.01); *H01M 2010/4271* (2013.01); *H01M 2200/00* (2013.01); *H02H 7/18* (2013.01); *Y02E 60/10* (2013.01)

(58) Field of Classification Search
  CPC .......... H01M 10/425; H01M 10/4285; H01M 2010/4271; H01M 10/48; H01M 2200/00; Y02E 60/10; H02H 7/18
  See application file for complete search history.

(56) References Cited

U.S. PATENT DOCUMENTS

| | | | |
|---|---|---|---|
| 9,459,328 B2 | 10/2016 | Lin | |
| 2008/0054848 A1* | 3/2008 | Yun | G01R 31/389 320/134 |
| 2013/0122332 A1 | 5/2013 | Van Lammeren et al. | |
| 2013/0271065 A1* | 10/2013 | Chou | G01R 31/36 320/107 |
| 2015/0048797 A1* | 2/2015 | Song | H02J 7/0031 320/134 |
| 2015/0066406 A1 | 3/2015 | Sun et al. | |
| 2016/0216337 A1* | 7/2016 | Milios | G01R 31/374 |
| 2016/0245871 A1 | 8/2016 | Joe | |
| 2019/0094307 A1 | 3/2019 | Brebant et al. | |

FOREIGN PATENT DOCUMENTS

| | | |
|---|---|---|
| CN | 102714422 A | 10/2012 |
| CN | 104820200 A | 8/2015 |
| CN | 105759221 A | 7/2016 |
| CN | 108548968 A | 9/2018 |
| CN | 108627723 A | 10/2018 |
| CN | 108680803 A | 10/2018 |
| CN | 107167677 A | 10/2024 |
| JP | 2007-195360 A | 8/2007 |
| JP | 2010-266439 A | 11/2010 |
| JP | 2010-286388 A | 12/2010 |
| JP | 2011-38928 A | 2/2011 |
| JP | 2012-105536 A | 5/2012 |
| JP | 2018-9939 A | 1/2018 |
| JP | 2018-506144 A | 3/2018 |
| KR | 10-2008-0018109 A | 2/2008 |
| KR | 10-1101947 B1 | 1/2012 |
| KR | 10-2014-0073627 A | 6/2014 |
| KR | 10-2014-0115617 A | 10/2014 |
| KR | 10-1603625 B1 | 3/2016 |
| KR | 10-2016-0069384 A | 6/2016 |
| KR | 10-2016-0077689 A | 7/2016 |
| KR | 10-1650415 B1 | 8/2016 |
| KR | 10-2017-0058038 A | 5/2017 |
| KR | 10-1748644 B1 | 6/2017 |
| KR | 10-2018-0006264 A | 1/2018 |
| KR | 10-2019-0115938 A | 10/2019 |
| KR | 10-2059381 B1 | 12/2019 |

OTHER PUBLICATIONS

International Search Report for PCT/KR2021/001047 mailed on May 13, 2021.

* cited by examiner

Conventional Art

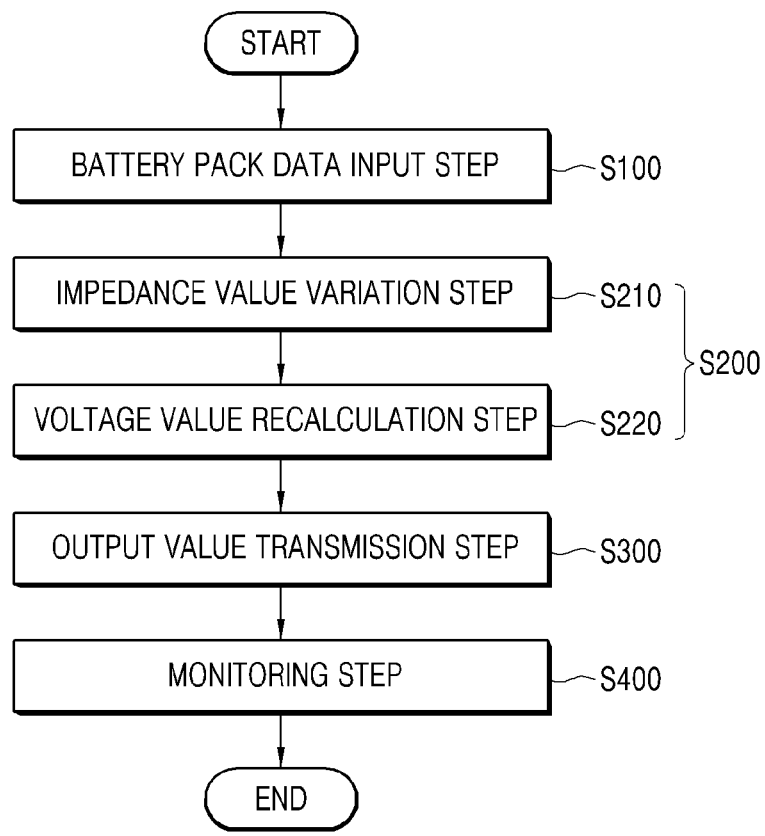

BATTERY PACK SIMULATION APPARATUS AND METHOD OF CHECKING BATTERY MANAGEMENT UNIT BY USING SAME

TECHNICAL FIELD

The present invention relates to a device and method for simulating a battery pack.

More specifically, the present invention relates to a battery simulation device and method for checking whether a battery management unit (BMU/BMS) of a battery pack and its protection algorithm operate normally according to a situation of the battery pack.

BACKGROUND ART

Recently, as the demand for portable electronic products such as laptops, video cameras, portable telephones, and the like is rapidly increasing and the development of electric vehicles, energy storage batteries, robots, satellites, and the like is in full swing, research on a high-performance battery pack capable of repetitive charging and discharging is being actively conducted. In addition, recently, as carbon energy is gradually depleted and interest in the environment increases, interest and research are focused on battery packs that may efficiently utilize stored power.

On the other hand, such a battery pack is equipped with a battery management unit (BMU) or a battery management system (BMS), and it is necessary to verify the function in advance whether it will operate normally during operation by connecting the actual battery to the BMU or BMS (In this specification, the term 'battery management unit' shall mean encompassing a general battery management unit (BMU) and a battery management system (BMS)).

Accordingly, it is necessary to connect the battery and check whether the battery management unit is operating properly during actual battery operation and there is a limit to this process by connecting the actual battery, so that a simulation device is needed to check whether the battery management unit connected through a simulation device that simulates a virtual battery is operating properly or not.

In this regard, in the case of Korean Patent Application No. 10-2014-0175284 filed by the applicant of the present invention, a device that inputs a set voltage, temperature, and current and simulates a battery device based on the input voltage, temperature, and current is presented.

However, since this conventional method does not reflect the change in the output voltage according to the impedance generated in the actual battery pack, this is different from the actual battery pack, so that there was a problem that the actual battery pack could not be accurately simulated, and although only a method of simulating a battery was presented, there was a limitation in that it could not provide a method to check the actual operation state of the BMS.

Accordingly, the present invention proposes a simulation device and method for simulating the actual operating state of the battery pack more similarly by reflecting the impedance generated in the battery pack and checking whether functions such as the protection operation of the battery management unit are normally performed with respect to these virtual batteries.

As related prior art of the present invention, there are Korean Patent Application Publication KR 2018-0006264 A, and Korean Patent Application Publication KR 2016-0069384 A.

DISCLOSURE

Technical Problem

The present invention provides a battery simulation device and method for checking whether a function of the battery management unit is normally performed by outputting an output value similar to that of an actual battery pack to a battery management unit.

Technical Solution

A battery pack simulation device according to an embodiment of the present invention may include an input unit that receives voltage values, current values, temperature, and initial impedance values of the virtual battery back, an output value generation unit that generates an output value based on the input voltage value, current value, temperature, and initial impedance value, an output unit that transmits the generated output value to the battery management unit, and a monitoring unit that monitors the operation of the battery management unit of the BMS.

The output value generation unit may include an impedance value variation unit configured to output a variable impedance value obtained by changing the received initial impedance value by a predetermined value at a predetermined time interval, and a voltage value recalculation unit configured to recalculate a voltage value based on the input current value and the impedance value.

The battery management unit (BMU) may perform a battery pack protection operation according to the recalculated voltage value, input current value, and temperature.

The monitoring unit may output a normal signal when the battery management unit (BMU) normally performs a battery pack protection operation according to the recalculated voltage value, input current value, and temperature, and output an error signal when the battery management unit (BMU) does not normally perform a battery pack protection operation according to the recalculated voltage value, the input current value, and temperature.

The monitoring unit may further include a comparison unit for comparing the variable impedance value and the calculation impedance value.

A method of checking whether a protection algorithm of a battery pack operates normally using a battery pack simulation device according to an embodiment of the present invention may include a battery pack data input step of inputting the voltage, current, temperature, and initial impedance of the battery pack, an output value generation step of generating an output value based on the input data, and a monitoring step of monitoring whether the battery management unit (BMU) normally performs the protection operation according to the output value transmission step of transmitting the generated output value to a battery management unit (BMU) and the transmitted output value.

The output value generation step may include an impedance value variation step of changing the received initial impedance value by a predetermined value at predetermined time intervals, and a voltage value recalculation step of recalculating a voltage value based on the input current value and the impedance value.

As the battery simulation device monitors the operation of the battery management unit, the monitoring step may output a normal signal when the battery management unit normally performs the battery pack protection operation, and output an error signal when the battery management unit does not normally perform the battery pack protection operation.

The battery management unit (BMU) may perform a comparison step of comparing the received initial impedance value and the measured impedance value of the battery pack, and control the operation of the battery management unit BMU according to the comparison result.

Advantageous Effects

According to the present invention, before attaching the battery management unit (BMU/BMS) to the battery pack by reflecting the impedance generated in the actual battery pack, it is possible to check whether or not it operates normally.

In addition, the present invention examines whether the protection operation in the battery pack is normally performed by reflecting the impedance generated in the actual battery pack, so that it is possible to check whether the protection operation of the battery pack is performed more accurately than the conventional test device and method.

DESCRIPTION OF DRAWINGS

FIG. 3 is a flowchart showing a battery pack simulation method according to an embodiment of the present invention.

MODE FOR INVENTION

Figure 1:
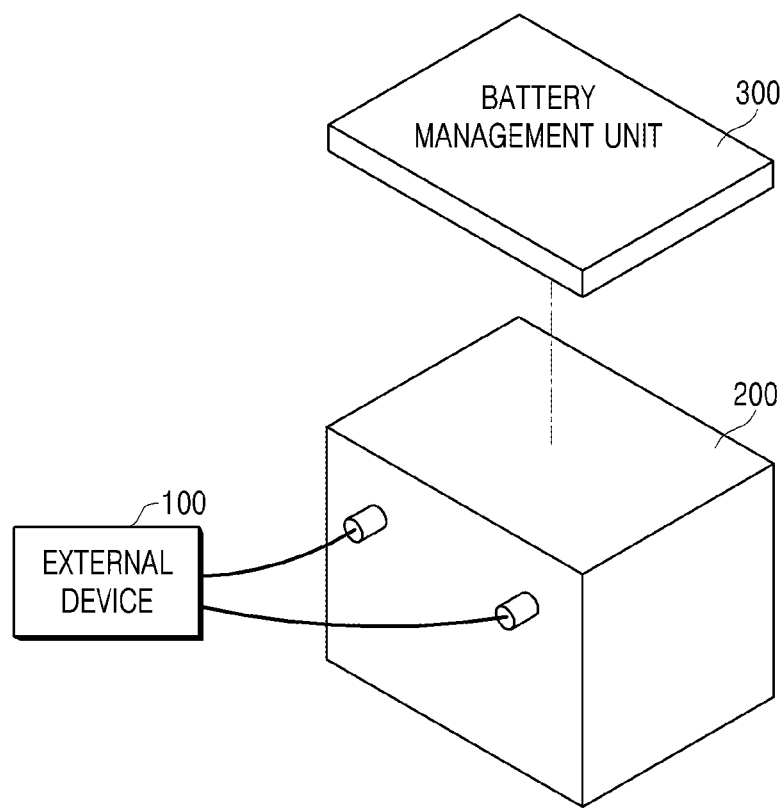
FIG. 1 is a view showing a connection state between a conventional battery pack and a battery management unit.

Hereinafter, embodiments of the present invention will be described in detail with reference to the accompanying drawings so that those of ordinary skill in the art may easily implement the present invention. However, the present invention may be implemented in various forms and is not limited to the embodiments described herein. In the drawings, parts irrelevant to the description are omitted in order to clearly describe the present invention, and like reference numerals refer to like elements throughout the specification.

1. Actual Battery Operation and Battery Management Unit

FIG. 1 is a diagram showing a connection state in which an actual battery pack 200 is driven by interlocking with the external device 100.

The battery inputs/outputs current/voltage while connected to an external device 100, which may be an electronic device acting as a load or a charging device that inputs a charging current into the battery, and the battery management unit 300 measures the voltage/current/temperature, and the like in real time, and performs an operation for protecting the battery.

2. Battery Pack Simulation Device according to Embodiment of Present Invention

Figure 2:
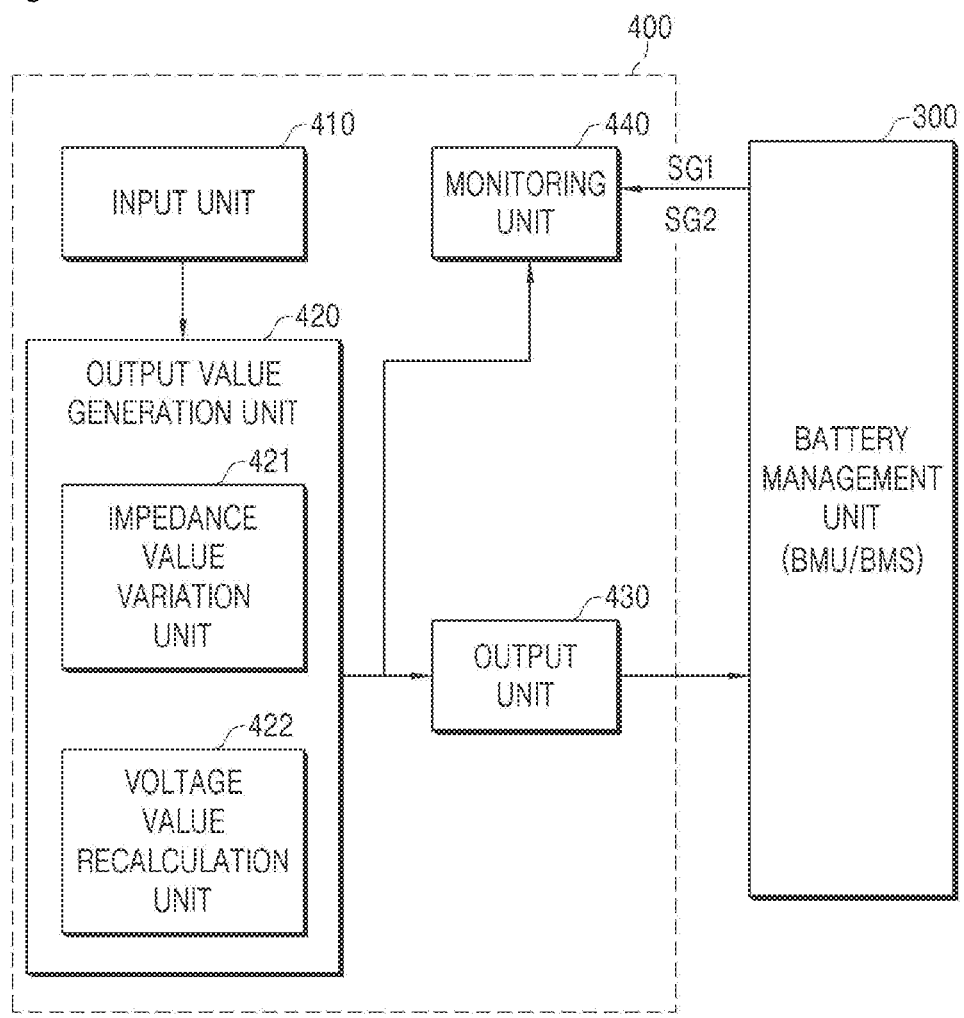
FIG. 2 is a block diagram showing a battery pack simulation device according to an embodiment of the present invention.

FIG. 2 is a block diagram showing a battery pack simulation device according to an embodiment of the present invention.

Hereinafter, a battery pack simulation device according to an embodiment of the present invention will be described with reference to FIG. 2.

The battery pack simulation device 400 according to an embodiment of the present invention includes an input unit 410 that receives voltage values, current values, temperature, and initial impedance values, an output value generation unit 420 that generates an output value based on the input voltage value, current value, temperature, and initial impedance value, an output unit 430 that transmits the generated output value to the battery management unit 300, and a monitoring unit 440 that monitors the operation of the battery management unit 300 of the BMS.

Each of the configurations will be described below.

2-1 Input Unit 410

The input unit 410 is a component for inputting a voltage value, a current value, a temperature, and an initial impedance value of a battery pack to be simulated.

For example, as shown in Table 1 below, a voltage value, a current value, a temperature, and an initial impedance value may be entered.

TABLE 1

| Time | Voltage (mV) | Current (mA) | Temperature (deg C.) | Initial impedance value (Ohm) |
| --- | --- | --- | --- | --- |
| T1 | 1200 | 0 | 25 | 1 |
| T2 | 1200 | 500 | 25 | 1 |
| T3 | 1200 | 1000 | 25 | 1 |
| T4 | 3800 | 0 | −20 | 1 |
| T5 | 3800 | −500 | −20 | 1 |
| T6 | 3800 | −1000 | −20 | 1 |

The voltage value, current value, temperature, and initial impedance value of the battery pack input as described above are transmitted to the output value generation unit 420 to be described later. The input data in Table 1 may be inputted by connecting an external input/output device, and may be implemented as a memory device storing input data. Among the input data items in Table 1, the voltage, current, and temperature values are data that simulate the voltage, current, and temperature values generated when driving a virtual battery, assuming the actual battery is driven, and the impedance value is a value that simulates the impedance value of an actual battery.

When initially driving the simulation device of the present invention, a predetermined initial impedance value is inputted, and the initial impedance value varies over time in the impedance value variation unit 421 described later, so that it is set to simulate an impedance value that changes during actual battery operation.

The input unit 410 has an interface connected to an input device such as a computer and a portable PDA device, and may receive data from these input devices and is equipped with a memory reader terminal such as a USB memory and may receive input data from the memory.

The input data is composed of the voltage value, current value, temperature, and initial impedance value of the battery pack that may simulate a virtual battery and is data that simulates a specification of a battery to be simulated, a driving state and a driving condition of the battery, and is referred to as "virtual battery pack initial data" in the present invention.

2-2 Output Value Generation Unit 420

The output value generation unit 420 is a component that generates an output value that simulates measurement data of an actual battery based on initial data of a virtual battery pack received from the input unit 410. The output value outputted from the simulation device is transmitted to the battery management unit (BMU) 300 through the output unit 430.

As for the output value, the received current value and temperature are outputted as they are, and the input voltage value and initial impedance value are converted through a predetermined process to generate an output value. These output values are 'virtual battery pack measurement data' that simulate voltage, current, temperature, and impedance measured during actual battery operation.

For example, the output value generation unit 420 includes an impedance value variation unit 421 for changing the received initial impedance value by a predetermined value at predetermined time intervals, and a voltage value recalculation unit 422 for recalculating a voltage value based on the input current value and the impedance value to change the impedance value and recalculate the voltage value accordingly.

2-2-1 Impedance Value Variation Unit 421

The impedance value variation unit 210 is configured to change an initial impedance value by a predetermined value at predetermined time intervals in order to simulate an impedance that fluctuates while the virtual battery is driven.

In this way, by receiving the initial impedance value and also changing the initial impedance value to reflect the actual battery impedance and provide an environment similar to that of using a real battery, it may be detected whether the battery management unit (BMU) normally performs a protection operation according to a change in impedance.

For example, if the initial impedance is 3 milliohms (3 mΩ), the impedance value variation unit may increase by 1 milliohm (1 mΩ) per second, thereby increasing the impedance to 10 milliohms (10 mΩ).

2-2-2 Voltage Value Recalculation Unit 422

The voltage value recalculation unit 220 is a component that calculates a voltage in which impedance is reflected.

Conventionally, since the simulation was performed with only the input voltage value without considering the impedance value, the impedance value or the impedance change of the actual battery pack was not reflected. That is, there was a difference between the input voltage value and the actual voltage of the battery pack.

In order to solve this problem, in the present invention, an impedance value or a variation value thereof generated in an actual battery pack is reflected in a voltage. Accordingly, simulation according to voltage fluctuations of the actual battery pack is possible.

For example, the input voltage in (Table 1) may be recalculated as shown in (Table 2) below by the input initial impedance value.

In (Table 2), it is shown that the current, temperature, and initial impedance values are the same as in (Table 1), and the voltage has changed to the recalculation voltage value by reflecting the impedance value.

TABLE 2

| Time | Recalculation Voltage Value (mV) | Current (mA) | Temperature (deg C.) | Initial Impedance Value (Ohm) |
|---|---|---|---|---|
| T1 | 1200 | 0 | 25 | 1 |
| T2 | 1700 | 500 | 25 | 1 |
| T3 | 2200 | 1000 | 25 | 1 |
| T4 | 3800 | 0 | −20 | 1 |
| T5 | 3300 | −500 | −20 | 1 |
| T6 | 2800 | −1000 | −20 | 1 |

That is, in (Table 2), if T1 and T4 are whben the current is 0 and the voltage values at this time are initially 1200 and 3800, respectively, T2 and T3 are when the battery current increases by 500 mA and 1000 mA, respectively, and T5 and T6 are when the battery current decreases by 500 mA and 1000 mA, respectively, and at this time, if each impedance value is 1Ω, the voltage value recalculation unit 422 recalculates the voltage values at T2, T3, T5, and T6 to 1700 mV, 2200 mV, 3300 mV, and 2800 mV, respectively.

(Table 3) shows the case where the impedance of the battery is changed to 2 Ohm.

TABLE 3

| Time | Recalculation Voltage Value (mV) | Current (mA) | Temperature (deg C.) | Variable Impedance Value (Ohm) |
|---|---|---|---|---|
| T1 | 1200 | 0 | 25 | 2 |
| T2 | 2200 | 500 | 25 | 2 |
| T3 | 3200 | 1000 | 25 | 2 |
| T4 | 3800 | 0 | −20 | 2 |
| T5 | 2800 | −500 | −20 | 2 |
| T6 | 1800 | −1000 | −20 | 2 |

That is, in (Table 3), since the impedance is 2 Ohm at T2, T3, T5, and T6, the voltage value calculator recalculates voltage values of 2200 mV, 3200 mV, 2800 mV, and 1800 mV, respectively.

As described above, the battery pack simulation device of the present invention simulates a state very similar to an actual operating state of a battery, that is, a state in which a voltage fluctuates due to a battery charging/discharging state and an impedance value of the battery and variations thereof.

Accordingly, the battery pack simulation device of the present invention transmits a voltage similar to that of the actual battery pack to the battery management unit 300 compared to the conventional simulation device, so that it is possible to check whether the battery management unit 300 operates normally in a situation similar to that of an actual battery pack.

2-3 Output Unit 430

The output unit 430 transmits the voltage, current, and temperature output values generated by the output value generation unit 420 to the battery management unit 300.

The output unit 430 also transmits the voltage, current, temperature, and impedance values generated by the output value generation unit 420 to the monitoring unit 440 to be described later.

The output unit 430 converts the data received from the output value generation unit into an actual physical output value and outputs the actual physical output value to the battery management unit 300 so that the battery management unit 300 may recognize the actual physical output value. For example, the output unit 300 converts information on a voltage value transmitted from the output value generation unit 420 into an actual voltage signal and outputs the actual voltage signal to the battery management unit 300.

Similarly, the current value is converted into an actual current signal so that the battery management unit 300 may receive the actual current signal, and the temperature value is also converted into the form of a signal received by the battery management unit 300 for temperature measurement and outputs the signal.

For example, the voltage and current output values output the actual voltage/current by configuring the power supply in the simulation device, and since the conventional battery management unit 300 calculates the temperature from the internal thermistor resistance measurement value and the conversion table, the output of the temperature value is converted into the thermistor input voltage value corresponding to the temperature and outputs the thermistor input voltage value. In order to convert these temperature values into corresponding thermistor input voltage values, the simulation device of the present invention may have a temperature conversion value table corresponding to the thermistor voltage built into the battery management unit 300 to be tested in the internal memory device.

2-4 Monitoring Unit 440

The monitoring unit 440 is a component that monitors how the battery management unit (BMU) 300 operates according to an output value generated by the output value generation unit 420.

The monitoring unit 440 receives from the battery management unit 300 at least one information among a battery charge/discharge cutoff signal SG1, an overcurrent/overvoltage cutoff control signal SG2, and a battery impedance measurement signal IM.

The battery charge/discharge cutoff signal SG1 and the overvoltage cutoff control signal SG2 may be the same signal depending on the battery management unit 300 performing a test, and although the output pin number may vary depending on the protection IC constituting the battery management unit 300, but it is possible for a person skilled in the art to configure an interface unit for extracting the signals from the battery management unit 300 and inputting the signals to the monitoring unit 440 by conventional techniques.

The monitoring unit 440 may include a protection condition determination unit, a comparison unit, and an error determination unit, and may determine whether the battery management unit 300 has an error through these.

2-4-1. Protection Condition Determination Unit

The protection condition determination unit determines whether battery protection conditions such as overcurrent/overvoltage control conditions or charge/discharge cutoff conditions are satisfied from the voltage, current, and temperature values of the virtual battery pack measurement data received from the output value generation unit 420, and generates a battery protection required signal as a result. The overcurrent/overvoltage conditions may vary depending on battery capacity, battery type, and the like, and these conditions may be pre-stored in the simulation device 400 in the protection condition determination unit or may be inputted together when battery simulation conditions (voltage, current, temperature, initial impedance) are inputted through the input unit 410.

2-4-2. Comparison Unit

The comparison unit compares the overcurrent/overvoltage conditions determined by the protection condition determination unit, the charge/discharge cutoff condition satisfaction signal, the battery charge/discharge cutoff signal SG1 received from the battery management unit 300, and the overcurrent/overvoltage cutoff control signal SG2 to determine matching.

For example, when the output values generated by the output value generation unit 420 are within a range in which an overvoltage cutoff protection operation should be performed among battery pack protection operations, the protection condition determination unit will determine that an overvoltage cutoff condition has occurred and calculate a battery protection required signal, and at this time, when the battery management unit 300 operates normally, since the overvoltage cutoff control signal SG2 will be transmitted to the monitoring unit 440, so that in this case, the comparison unit compares both signals and transmits a normal determination signal to the error determination unit.

However, even though the output values generated by the output value generation unit 420 are within the range in which the overvoltage cutoff protection operation should be performed during the battery pack protection operation, when the battery management unit 300 does not perform an overvoltage cutoff protection operation, it is determined that the battery management unit 300 does not operate normally.

The battery charge/discharge cutoff signal SG1 is also compared in the comparison unit to determine whether the battery management unit 300 is normally operating in the same process.

That is, the comparison unit and the battery management unit 300 each determine whether the battery protection condition is satisfied from the virtual battery pack measurement data, and generate a battery protection required signal and a battery control signal, and the comparison unit compares these two signals to determine whether the battery management unit 300 operates normally.

The comparison unit also receives the calculation impedance value calculated from the battery management unit 300, and compares this with the variable impedance value outputted from the output value generation unit 420 to determine whether the battery management unit 300 operates normally. When the actual battery is operated, the battery management unit 300 calculates the battery impedance from the battery current/voltage value, and when the simulation device 400 of the present invention is connected, the impedance of the virtual battery is calculated from the current/voltage value inputted from the output unit 430 using an internal algorithm to calculate the calculated battery impedance value.

The battery management unit 300 outputs the calculated battery impedance value as an impedance signal IM to the monitoring unit 440, and the comparison unit receives this and compares the output value with the actual impedance value of the virtual battery received from the generation unit 420 to detect whether there is an abnormality in the impedance calculation internal algorithm of the battery management unit 300 and an error in the impedance calculation configuration of the battery management unit 300.

The actual impedance value of the virtual battery is an impedance value varied in the impedance value variation unit 421 with respect to the initial impedance value given through the input unit 410, and is a value outputted from the generation unit 420 to the monitoring unit 440 along with corresponding current and voltage values by applying an impedance change as in an actual battery.

2-4-3. Error Determination Unit

The error determination unit determines whether or not the battery management unit 300 is normally operated according to the comparison result of the comparison unit. The error determination unit or the battery pack simulation device 400 according to an embodiment of the present invention may further include a display unit that displays a result of determining whether the normal operation is performed at a predetermined position.

For example, if it is determined that the battery management unit 300 is operating normally, the comparison unit transmits a normal signal to the display unit, and the display unit outputs a display indicating the normal state, and if it is determined that the battery management unit 300 is not operating normally, the monitoring unit 440 may transmit a defective signal to the display unit, and the display unit may output a display indicating a defective state.

2-5. Battery Management Unit 300
2-5-1. Impedance Calculation

As previously explained, the battery management unit 300 calculates the impedance value of the virtual battery based on the current/voltage value of the virtual battery generated by the output value generation unit 420 through the internal impedance calculation configuration of the battery management unit 300 for the corresponding virtual battery, and outputs the impedance signal IM to the monitoring unit 440.

That is, the battery management unit 300 receives a signal such as a current/voltage value inputted from an actual battery from the battery pack simulation device 400 of the present invention, and calculates an impedance value based on this and outputs it to the monitoring unit 440, so that the monitoring unit 440 determines whether the battery management unit 300 is abnormal by checking whether the battery management unit 300 has correctly calculated the impedance.

2-5-2. Generation of Battery Charge/Discharge Cutoff Signal SG1 and Overcurrent/Overvoltage Cutoff Control Signal SG2

In addition, the battery management unit 300 generates a battery charge/discharge cutoff signal SG1 for preventing overcharge/overdischarge and an overcurrent/overvoltage cutoff control signal SG2 based on the current/voltage inputted from the output value generation unit 420, and transmits the signals to the monitoring unit 440.

That is, the battery management unit 300 receives a signal such as a current/voltage value inputted from an actual battery from the battery pack simulation device 400 of the present invention, and based on this, determines whether overcurrent/overvoltage, overcharge/overdischarge to transmits the determination signal or control signal to the monitoring unit 440, and the monitoring unit 440 determines whether the charge/discharge cutoff signal SG1 and the overcurrent/overvoltage cutoff control signal SG2 transmitted from the battery management unit 300 are correctly generated detect whether the battery management unit 300 is abnormal.

3. Method for Determining Whether Battery Management Unit Operates Normally Through Simulation of Battery Pack According to Embodiment of Present Invention FIG. 3 is a flowchart illustrating a method of checking a battery management unit using a simulation device of a battery pack according to an embodiment of the present invention.

Hereinafter, a battery pack simulation method according to an embodiment of the present invention will be described with reference to FIG. 3.

The battery pack simulation method according to an embodiment of the present invention includes a battery pack data input step S100 of inputting the voltage, current, temperature, and initial impedance of the battery pack, an output value generation step S200 of generating an output value based on the input data, an output value transmission step S300 of transmitting the generated output value to the battery management unit 300 and a monitoring step S400 of monitoring whether the battery management unit 300 operates normally according to the transmitted output value.

3-1 Battery Pack Data Input Step S100

The battery pack data input step S100 is a process of inputting battery pack data, such as voltage value, current value, temperature, and initial impedance value of the battery pack to be simulated. This is achieved through the input unit 410 of the simulation device 400 of the present invention described above.

The input data is composed of the voltage value, current value, temperature, and initial impedance value of the battery pack that may simulate a virtual battery and is data that implements a specification of a battery to be simulated, a driving state and a driving condition of the battery, and is referred to as virtual battery pack data.

The virtual battery pack data input in the battery pack data input step S100 is transmitted to the output value generation unit 420, and is generated as an output value (virtual battery pack measurement data) through the output value generation step S200 described below.

3-2 Output Value Generation Step S200

The output value generation step S200 is a process of generating virtual battery pack measurement data that is an output value outputted from the simulator based on the battery pack data input in the battery pack data input step S100.

As an example, it receives battery pack data including voltage, current, temperature, and initial impedance values and outputs virtual battery pack measurement data, and the current value and temperature inputted in the battery pack data input step S100 outputs the received value as it is, and the voltage and impedance values vary the initial impedance value and output a recalculation voltage value obtained by recalculating a voltage value from the changed impedance value and the current value.

3-2-1 Impedance Value Variation Step S210

The impedance value variation step S210 is a process of simulating that the impedance value of a virtual battery pack varies over time, and is a process of calculating a 'virtual impedance value' which is a changed impedance value by changing an initial impedance value inputted as battery pack data by a predetermined value at predetermined time intervals. In the example of (Table 3) above, T1 and T4 were set as the initial time, and the impedance values were changed by 1 for each of the initial impedance values in (Table 1) in the intervals T1 to T3 and T4 to T5.

Through the virtual impedance value calculated as described above, in the monitoring process to be described later, in response to a change in the impedance of the battery, the battery management unit 300 may monitor whether it operates normally.

3-2-2 Voltage Value Recalculation Step S220

The voltage value recalculation step S220 is a process of calculating a 'recalculation voltage' in which the virtual impedance value is reflected. The recalculation voltage is a 'virtual battery measurement voltage' that simulates the actual measurement voltage of a virtual battery.

The actual battery pack has a change in impedance. When the impedance changes, the voltage of the battery pack also changes. Conventionally, since the simulation was performed with the input voltage value without considering the impedance generated from the actual battery pack, there was a difference between the voltage of the actual battery pack and the simulated voltage, and in addition, there was a problem in that it was not known whether the battery management unit 300 accurately calculates the impedance.

In order to solve this, in the present invention, by reflecting the impedance of the battery and the fluctuating impedance through the voltage recalculation step S220, the virtual battery measurement voltage is obtained by recalculating the virtual battery voltage from the virtual impedance value and the current value of the input battery pack data. This virtual battery measurement voltage value (recalculation voltage value) is inputted to the battery management unit 300, and the battery management unit 300 calculates a calculation impedance value from the current value and the virtual battery voltage value of the battery pack data.

Through the voltage value recalculation step S220, it is possible to simulate the voltage fluctuation of the actual battery pack and by verifying whether the impedance value calculated by the battery management unit 300 from the recalculation voltage value and the variable impedance value obtained by varying the initial impedance value in the impedance value variation unit match or not in the monitoring unit 440, it is possible to check the function of the battery management unit 300 by reading whether the impedance calculation function of the battery management unit 300 is normal/abnormal.

3-3 Output Value Transmission Step S300

The transmission step S300 is a process of transmitting the output value of the output value generation unit 420 generated in the above-described output value generation step S200 to the battery management unit 300.

The output value is virtual battery pack measurement data that simulates a voltage/current/temperature/impedance value of a battery during actual battery operation, and checks whether the battery management unit 300 operates normally.

3-4 Monitoring Step S400

The monitoring step S400 is a process of monitoring whether the battery management unit 300 operates normally according to the output value generated in the output value generation step S200.

Specifically, in the case where the generated output values are within the range in which the overvoltage cutoff protection operation should be performed during the battery pack protection operation, when the battery management unit 300 normally performs the overvoltage cutoff protection operation, it is determined that the battery management unit 300 operates normally. However, even though the generated output values are within the range in which the overvoltage cutoff protection operation should be performed during the battery pack protection operation, when the battery management unit 300 does not perform an overvoltage cutoff protection operation, it is determined that the battery management unit 300 does not operate normally.

The monitoring step S400 may include an impedance calculation function monitoring procedure, an overcharge/overdischarge control function monitoring procedure, and an overcurrent/overvoltage control function monitoring procedure as follows.

3-4-1. Impedance Calculation Function Monitoring Procedure

Typically, the battery management unit 300 calculates the battery impedance from the battery current/voltage or current/voltage/temperature.

In the present invention, since the battery simulation device 400 simulates an actual battery, the battery management unit 300 calculates a 'calculation impedance value' from a voltage/current or voltage/current/temperature value among virtual battery pack measurement data that is an output value outputted from the output unit 430 of the battery simulation device 400.

However, the virtual battery pack measurement data includes a 'virtual impedance value' corresponding to the voltage/current or voltage/current/temperature value inputted to the battery management unit 300 generated in the output value generation step S200.

The monitoring unit 440 of the battery simulation device 400 of the present invention receives the 'calculation impedance value' from the battery management unit 300, and receives the 'virtual impedance value' generated from the output value generation unit 420 in the same time interval in which the calculation impedance value is calculated to compare them with each other, so that it is monitored whether the impedance calculation function of the battery management unit 300 operates normally.

When the 'calculation impedance value' and the 'virtual impedance value' match within a predetermined range, it is determined that the impedance calculation function of the battery management unit 300 operates normally, and otherwise, it is determined that the impedance calculation function of the battery management unit 300 does not operate normally.

For example, when the data in Table 3 are outputted to the battery management unit 300 from the output value generation unit 420, the battery management unit needs to calculate an impedance value of 2 Ohm at T2 and transmit it to the monitoring unit 440, and if the comparison result in the monitoring unit 440 is not 2 Ohm, it is determined that the impedance calculation function of the battery management unit is abnormal.

3-4-2. Battery Pack Protection Function Monitoring Procedure

The battery management unit 300 performs a battery protection function based on the battery voltage/current measurement value. The monitoring procedure of the present invention includes a procedure for monitoring such a battery pack protection function, and this may include a protection function execution condition determination procedure in which the battery pack simulation device determines whether an execution condition of a battery protection function including at least one control among overcharge/overdischarge control or overvoltage/overcurrent control functions is satisfied from the virtual battery pack measurement data; a battery protection control signal receiving procedure in which the battery management unit receives a protection control signal for at least one control among the overcharge/overdischarge control or overvoltage/overcurrent control functions, which is generated from the virtual battery pack floor data; and a determination procedure for determining whether the battery protection function of the battery management unit normally operates based on whether the protection control signal is normally received may be configured when the protection function execution condition is satisfied.

In addition, the battery pack protection function may include an overcharge/overdischarge control function and an overcurrent/overvoltage control function, and each of these will be described as follows.

3-4-2-1. Overcharge/Overdischarge Control Function Monitoring Procedure

Typically, the battery management unit 300 measures the voltage of the battery, detects an overcharge/overdischarge state accordingly, and outputs a charge/discharge cutoff control signal to prevent this. The simulation device 400 of the present invention monitors whether a normal control signal is outputted under voltage conditions in which a control signal should be generated by receiving such a charge/discharge cutoff control signal from the battery management unit 300.

This overcharge/overdischarge control function monitoring procedure receives the fluctuating voltage value outputted from the output value generation unit 420 by the monitoring unit 440, and determines whether the overcharge/overdischarge control is to be performed in the corresponding battery to be simulated and in the case of voltage section where overcharge/overdischarge control should be executed, determines whether a 'charge/discharge cutoff control signal' for the variable voltage value is received from the battery management unit 300 to determine whether the overcharge/overdischarge control function of the battery management unit 300 operates normally.

3-4-2-2. Overcurrent/Overvoltage Control Function Monitoring Procedure

In addition, the battery management unit 300 outputs a control signal for resolving an overcurrent/overvoltage condition with respect to an overcurrent/overvoltage condition of the battery.

The simulation device 400 of the present invention monitors whether or not the battery management unit 300 normally generates a control signal for such an overcurrent/overvoltage control signal from the battery management unit 300.

In this overcurrent/overvoltage control function monitoring procedure, the monitoring unit 440 receives the fluctuating current/voltage value outputted from the output value generation unit 420, and determines whether the overvoltage/overcurrent control should be performed in the corresponding battery to be simulated, and in the case of a voltage/current section in which overvoltage/overcurrent control should be performed, determines whether an 'overvoltage/overcurrent cutoff control signal' is received from the battery management unit 300 to determine whether the overvoltage/overcurrent control function of the battery management unit 300 operates normally.

Meanwhile, the battery pack simulation device according to an embodiment of the present invention may be configured to further include a display step of displaying the test result.

For example, if it is determined that the battery management unit 300 operates normally in the monitoring step S400, in the display step, a normal signal is transmitted to the display unit, and the display unit outputs a display indicating a normal state, and in the monitoring step S400, if it is determined that the battery management unit 300 does not operate normally, by transmitting the defective signal to the display unit, the display unit may output a display indicating a defective state.

On the other hand, although the technical idea of the present invention has been specifically described according to the above embodiment, it should be noted that the above embodiments are for the purpose of explanation and not limitation. In addition, those skilled in the art in the technical field of the present invention will be able to understand that various embodiments are possible within the scope of the spirit of the present invention.

What is claimed is:

1. A battery pack simulation device connected to a battery management unit to check a function of the battery management unit, the device comprising:
    an input unit configured to receive initial data of a virtual battery pack including a voltage value, a current value, and an initial impedance value of the virtual battery pack;
    an output value generation unit configured to generate virtual battery pack measurement data including an impedance value and a voltage value varying based on the received voltage value, current value, and initial impedance value;
    a transmission unit configured to transmit at least a part of the generated virtual battery pack measurement data to the battery management unit; and
    a monitoring unit configured to receive predetermined information related to the function of the battery management unit, from the battery management unit, and monitor whether the battery management unit operates normally based on the predetermined information,
    wherein the output value generation unit comprises an impedance value variation unit configured to output a variable impedance value obtained by changing the received initial impedance value by a predetermined value at a predetermined time interval.

2. The device of claim 1, wherein the output value generation unit further comprises:
    a voltage value recalculation unit configured to recalculate a voltage value based on the input current value and the impedance value.

3. The device of claim 2, wherein the virtual battery pack measurement data comprises the recalculated voltage value and the inputted current value as a virtual measurement voltage value and a virtual measurement current value, respectively, and
    wherein the monitoring unit receives a calculation impedance value at the virtual measurement voltage calculated by the battery management unit based on the virtual measurement voltage value and the virtual measurement current value.

4. The device of claim 3, wherein the monitoring unit further comprises a comparison unit for comparing the variable impedance value and the calculation impedance value.

5. The device of claim 4, wherein a normal or abnormal operation signal of the battery management unit is outputted according to a comparison result of the comparison unit.

6. The device of claim 2, wherein the monitoring unit receives a battery control signal generated by the battery management unit from the virtual measurement voltage value and the virtual measurement current value.

7. The device of claim 6, wherein the monitoring unit further comprises:
    a protection condition determination unit configured to determine whether a battery protection condition is satisfied from the virtual battery pack measurement data and generate a battery protection required signal; and
    a comparison unit configured to compare the battery control signal received from the battery management unit with the battery protection required signal.

8. The device of claim 7, wherein the monitoring unit further comprises an error determination unit configured to determine whether the battery management unit is normally operated according to a comparison result of the comparison unit.

9. A method of checking a function of a battery management unit using a battery pack simulation device, the method comprising:
    inputting battery pack data including voltage, current, temperature, and initial impedance of a battery pack into the battery pack simulation device;
    generating virtual battery pack measurement data based on the inputted battery pack data in the battery pack simulation device;
    transmitting the generated output value from the battery pack simulation device to the battery management unit;
    monitoring whether the battery management unit is operating normally in the battery pack simulation device; and
    generating a virtual impedance value by changing the received initial impedance value by a predetermined value at a predetermined time interval.

10. The method of claim 9, wherein the generating virtual battery pack measurement data comprises:

calculating a virtual battery pack measurement voltage by recalculating a voltage value based on the received current of the battery pack data and the virtual impedance value.

11. The method of claim 10, wherein as the battery simulation device monitors an operation of the battery management unit, and wherein the monitoring step outputs a normal signal when the battery management unit normally performs a battery pack protection operation, and outputs an error signal when the battery management unit does not normally perform the battery pack protection operation.

12. The method of claim 10, wherein the monitoring whether the battery management unit is operating normally comprises:

by the battery pack simulation device, receiving a calculation impedance value calculated by the battery management unit from the virtual battery pack measurement voltage; and comparing the virtual impedance value corresponding to the virtual battery measurement voltage with the calculation impedance value to determine whether the impedance calculation function of the battery management unit operates normally.

13. The method of claim 10, wherein the monitoring whether the battery management unit is operating normally comprises, by the battery pack simulation device:

a protection function execution condition determination procedure for determining whether an execution condition of a battery protection function including at least one control among overcharge/overdischarge control or overvoltage/overcurrent control functions is satisfied from the virtual battery pack measurement data;

a battery protection control signal receiving procedure for receiving a protection control signal for at least one control among the overcharge/overdischarge control or overvoltage/overcurrent control functions generated by the battery management unit from the virtual battery pack measurement data; and a determination procedure of determining whether the battery protection function of the battery management unit normally operates based on whether the protection control signal is normally received when the protection function execution condition is satisfied.

14. The method of claim 10, wherein the monitoring whether the battery management unit is operating normally comprises an error determination including determining whether the battery management unit is normally operated according to a comparison result.

* * * * *